US011121294B2

(12) United States Patent
Sobczyk

(10) Patent No.: US 11,121,294 B2
(45) Date of Patent: Sep. 14, 2021

(54) RADIATION-EMITTING COMPONENT AND METHOD FOR PRODUCING A RADIATION-EMITTING COMPONENT

(71) Applicant: OSRAM Opto Semiconductors GmbH, Regensburg (DE)

(72) Inventor: Sandra Sobczyk, Regensburg (DE)

(73) Assignee: OSRAM OLED GMBH, Regensburg (DE)

(*) Notice: Subject to any disclaimer, the term of this patent is extended or adjusted under 35 U.S.C. 154(b) by 0 days.

(21) Appl. No.: 16/604,282

(22) PCT Filed: May 16, 2018

(86) PCT No.: PCT/EP2018/062798
§ 371 (c)(1),
(2) Date: Oct. 10, 2019

(87) PCT Pub. No.: WO2018/215268
PCT Pub. Date: Nov. 29, 2018

(65) Prior Publication Data
US 2020/0144463 A1 May 7, 2020

(30) Foreign Application Priority Data
May 24, 2017 (DE) .......................... 102017111426.2

(51) Int. Cl.
*H01L 33/50* (2010.01)
*H01L 33/48* (2010.01)
(Continued)

(52) U.S. Cl.
CPC .......... *H01L 33/508* (2013.01); *H01L 33/486* (2013.01); *H01L 33/504* (2013.01);
(Continued)

(58) Field of Classification Search
CPC ..... H01L 33/504; H01L 33/508; H01L 33/60; H01L 2933/0041; H01L 33/486; H01L 2933/058; H01L 33/56; H01L 2933/005
(Continued)

(56) References Cited

U.S. PATENT DOCUMENTS 10,221,353 B2   3/2019  Tchoul et al.
2006/0034084 A1  2/2006  Matsuura et al.
(Continued)

FOREIGN PATENT DOCUMENTS

DE  112015001546 T5  1/2017
EP       2226861 A2    9/2010
(Continued)

OTHER PUBLICATIONS

Duris S 5, Data Sheet, Version 1.2, GD PSLR31.13, OSRAM Opto Semiconductors, Sep. 23, 2016, 21 pages.

*Primary Examiner* — Matthew E Warren
(74) *Attorney, Agent, or Firm* — Slater Matsil, LLP

(57) ABSTRACT

A radiation emitting component and a method for producing a radiation emitting component are disclosed. In an embodiment a radiation emitting component includes a radiation emitting semiconductor chip having an active zone configured to generate electromagnetic radiation of a first wavelength range, a reflector having side walls and a bottom surface and a conversion layer comprising a first phosphor configured to convert the electromagnetic radiation of the first wavelength range into electromagnetic radiation of a second wavelength range, wherein the conversion layer is located at the side walls of the reflector, wherein the conversion layer has a cross-sectional area, which decreases from the bottom surface of the reflector to a radiation exit surface of the component, and wherein the reflector is filled with a conversion element comprising a second phosphor configured to convert electromagnetic radiation of the first
(Continued)

wavelength range into electromagnetic radiation of a third wavelength range.

15 Claims, 3 Drawing Sheets

(51) Int. Cl.
    *H01L 33/56*     (2010.01)
    *H01L 33/60*     (2010.01)

(52) U.S. Cl.
    CPC .............. *H01L 33/56* (2013.01); *H01L 33/60* (2013.01); *H01L 2933/005* (2013.01); *H01L 2933/0041* (2013.01); *H01L 2933/0058* (2013.01)

(58) Field of Classification Search
    USPC .................................................. 257/98–100
    See application file for complete search history.

(56) References Cited

U.S. PATENT DOCUMENTS

| | | | |
|---|---|---|---|
| 2008/0265266 | A1 | 10/2008 | Bogner et al. |
| 2015/0263243 | A1* | 9/2015 | Nakagawa ............ H01L 33/504 257/98 |
| 2017/0040505 | A1* | 2/2017 | You .................... C09K 11/0883 |

FOREIGN PATENT DOCUMENTS

| | | | |
|---|---|---|---|
| JP | 2003142737 | A | 5/2003 |
| WO | 02052615 | A2 | 7/2002 |

* cited by examiner

FIG 5
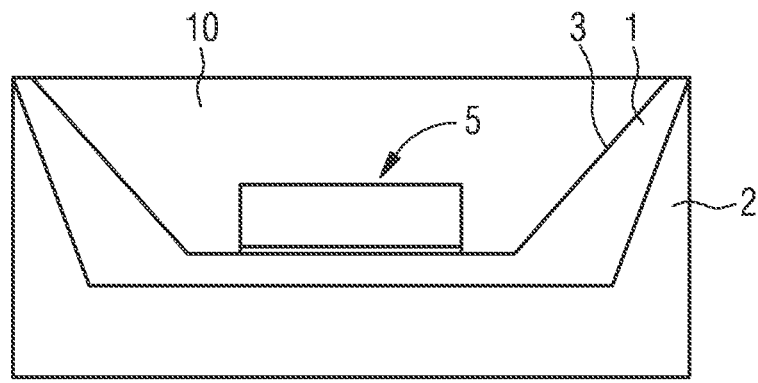
FIG 6
| | | |
|---|---|---|
| $\Phi_e$ | 0.372 W<br>100% | 0.392 W<br>105.4% |
| $\Phi_v$ | 125.3 Lm<br>100% | 130.7 Lm<br>104.3% |
| CRI | 79 | 81 |
FIG 7
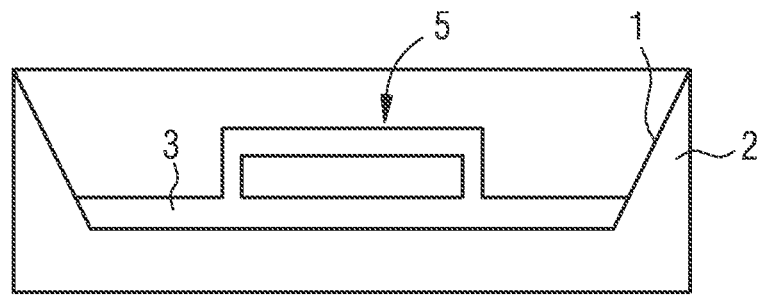

RADIATION-EMITTING COMPONENT AND METHOD FOR PRODUCING A RADIATION-EMITTING COMPONENT

This patent application is a national phase filing under section 371 of PCT/EP2018/062798, filed May 16, 2018, which claims the priority of German patent application 102017111426.2, filed May 24, 2017, each of which is incorporated herein by reference in its entirety.

TECHNICAL FIELD

A radiation emitting component and a method for manufacturing a radiation emitting component are given.

BACKGROUND

Radiation emitting components are described in documents U.S. Patent Publication No. 2008/0265266 A1 and International Publication No. WO 02/052615 A2, for example.

SUMMARY OF THE INVENTION

Embodiments provide a radiation emitting component with increased brightness and increased efficiency. Further embodiments provide a method for the manufacturing a radiation emitting component with increased brightness and increased efficiency.

According to an embodiment, the radiation emitting component comprises a radiation emitting semiconductor chip with an active zone, in which electromagnetic radiation of a first wavelength range is generated during operation. It is also possible that the component comprises several radiation emitting semiconductor chips.

According to a further embodiment, the radiation emitting component comprises a reflector, which has side walls and a bottom surface. Herein, the side walls are preferably arranged circumferentially around the bottom surface.

Particularly preferably, the reflector is part of a prefabricated housing. For example, the housing comprises a housing body and a lead frame, which is embedded in the housing body. In this case, the lead frame is preferably located in places free on the bottom surface of the reflector for electrical contacting of the semiconductor chip. For example, the side walls of the reflector are formed by side walls of the housing body, while the bottom surface is formed in places by the lead frame and in places by the housing body. The housing body, for example, is formed from a plastic such as an epoxy resin, while the lead frame can be formed from a metal such as, for example, silver.

The side walls of the reflector preferably enclose an acute angle $\alpha$ with a normal of the bottom surface. The angle $\alpha$ preferably has a value between 0° and 70°, inclusive.

According to a further embodiment, the radiation emitting component comprises a conversion layer with a first phosphor that converts electromagnetic radiation of the first wavelength range into electromagnetic radiation of a second wavelength range. The first wavelength range and the second wavelength range are preferably different from each other.

Particularly preferably, the conversion layer is applied to the side walls of the reflector, for example, in direct contact. The conversion layer can be applied to the entire surface of the side walls of the reflector so that the side walls of the reflector are no longer freely accessible from the outside.

In the present component, at least the side walls of the reflector are preferably covered with the conversion layer, which preferably converts blue light from the semiconductor chip into red light. Furthermore, it is also possible that the conversion layer converts green light into red light in addition to blue light. The reflector is usually formed by materials that have a higher absorption for unconverted blue radiation than for converted red radiation. Inter alia by the coverage of the side walls of the reflector the brightness of the component is increased, since only a very small part of primary blue radiation impinges on the reflector at all.

According to a further embodiment of the radiation emitting component, the conversion layer has a cross-sectional area that decreases from the bottom surface of the reflector to a radiation exit surface of the component. In other words, the thickness of the conversion layer along the side walls of the reflector preferably alters such that the thickness of the conversion layer decreases from the bottom surface of the reflector to the radiation exit surface of the component.

Particularly preferably, the cross-sectional area of the conversion layer decreases continuously from the bottom surface of the reflector to the radiation exit surface of the component. For example, the cross-sectional area of the conversion layer has a minimum value between 30 micrometer and 60 micrometer, inclusive. A lower limit for the maximum value of the cross-sectional area of the conversion layer results from the respective minimum value, while an upper limit for the maximum value of the cross-sectional area can be determined from the formula D-n*L-d, wherein D is a diameter of the bottom surface, n is the number of semiconductor chips on the bottom surface, L is an edge length of the semiconductor chips, and d is a distance between the semiconductor chips, if the component has several semiconductor chips.

According to a further embodiment of the radiation emitting component, the conversion layer has an inclined outer surface that includes an angle $\beta$ between 10° and 70°, inclusive, with the normal of the bottom surface. Particularly preferably, the angle $\alpha$ is different to the angle $\beta$, in particular the angle $\beta$ is preferably larger than the angle $\alpha$. For example, the angle $\beta$ is at least 5° larger than the angle $\alpha$.

In other words, the side walls of the reflector have particularly preferably a different inclination than the outer surface of the conversion layer. The outer surface of the conversion layer preferentially acts as a reflector for the electromagnetic radiation of the semiconductor chip, which deflects the electromagnetic radiation of the semiconductor chip to the radiation exit surface of the component. With the help of the conversion layer, whose outer surface has a different inclination than the reflector, the deflection of the electromagnetic radiation of the semiconductor chip to the radiation exit surface of the component can be particularly well adjusted. This increases the brightness and efficiency of the component.

According to a further embodiment of the radiation emitting component, the reflector is filled with a conversion element. The conversion element is preferably formed as a volume casting. For example, the conversion element completely fills the recess, which is laterally limited by the outer surface of the conversion layer. Preferably, the conversion element completely envelops a radiation exit surface of the semiconductor chip.

The conversion element has preferably a second phosphor that converts electromagnetic radiation of the first wavelength range into electromagnetic radiation of the third wavelength range. Preferably, the third wavelength range is different from the first wavelength range and from the second wavelength range. Furthermore, it is also possible that the first phosphor converts radiation of the third wavelength range into radiation of the second wavelength range. In other words, it is possible that the first phosphor converts radiation that has already been converted by the second phosphor into radiation of the second wavelength range. For example, the first phosphor converts green converted radiation into red radiation.

The first wavelength range is preferably composed of wavelengths of a blue color, while the second wavelength range is preferably composed of wavelengths of a red color and the third wavelength range is composed of wavelengths of a green color. Preferably, the semiconductor chip therefore emits blue light, which is at least partially converted into red light by the first phosphor and at least partially converted into green light by the second phosphor. The component preferably emits white light from its radiation exit surface, which is composed of unconverted blue light from the semiconductor chip, converted red light from the first phosphor and converted green light from the second phosphor. The color temperature of the white light is preferably between 2700 K and 5000 K, inclusive. For this, the concentration of the second phosphor is preferably greater than the concentration of the first phosphor.

For example, the first phosphor and/or the second phosphor are each present as a plurality of particles.

According to a further embodiment of the radiation emitting component, the conversion layer comprises a first silicone resin, in which the particles of the first phosphor are incorporated. Furthermore, it is also possible that the conversion layer is formed from a first silicone resin, into which the particles of the first phosphor are incorporated.

According to a further embodiment of the radiation emitting component, the conversion element comprises a second silicone resin, into which the particles of the second phosphor are incorporated. It is also possible that the conversion element is formed from a second silicone resin, in which particles of the second phosphor are incorporated.

Particularly preferably, a grain size of the first phosphor is smaller than a grain size of the second phosphor.

For example, the particles of the first phosphor have a grain size between 5 micrometer and 20 micrometer, inclusive.

For example, the particles of the second phosphor have a grain size between 8 micrometers and 40 micrometers, inclusive.

Particularly preferably, a refractive index of the first silicone resin is smaller than a refractive index of the second silicone resin. This increases the reflectivity of the conversion layer and consequently the efficiency of the component.

The first silicone resin preferably has a refractive index between 1.3 and 1.45, inclusive, for light with a wavelength of approximately 450 nanometers.

The second silicone resin preferably has a refractive index between 1.55 and 1.7, inclusive, for light of a wavelength of approximately 450 nanometers.

Preferably, the first phosphor converts blue radiation into red radiation. For example, red emitting nitrides are suitable as materials for the first phosphor. Furthermore, organic materials are also suitable for the first phosphor.

Preferably, the second phosphor converts blue radiation into green radiation. For example, garnets such as YAG:Ce are suitable as materials for the second phosphor. Furthermore, organic materials are also suitable for the second phosphor.

Preferably, the conversion layer is free of particles of the second phosphor and the conversion element is free of particles of the first phosphor, as far as this is technically possible. In other words, the first phosphor and the second phosphor are preferably arranged separately.

Particularly preferably, the radiation exit surface of the semiconductor chip is free of particles of the first, preferably red, emitting phosphor and is only in direct contact with particles of the second, preferably green, emitting phosphor in places. Since red emitting phosphor particles generally scatter more than green emitting phosphor particles, the undesired backscattering of radiation onto the semiconductor chip is reduced in this arrangement. This also increases the efficiency and the brightness of the component.

Particularly preferably, the second phosphor in the second silicone resin has a lower concentration than the first phosphor in the first silicone resin. This also reduces undesired backscattering on the semiconductor chip and increases the efficiency of the component.

For example, the first phosphor in the first silicone resin has a concentration between 4% and 12%, inclusive. The second phosphor in the second silicone resin preferably has a concentration between 10% and 60%, inclusive. Particularly preferably, the concentration of the second phosphor is greater than the concentration of the first phosphor. In such a way a component can be produced which emits mixed colored light with a color temperature in the white range between 2700 K and 5000 K, inclusive.

According to a further embodiment of the radiation emitting component, the bottom surface of the reflector is also covered with the conversion layer. The bottom surface of the reflector can be completely covered with the conversion layer or can only be arranged circumferentially around the semiconductor chip. Preferably, at least electrical contact points of the bottom surface, which can be formed, for example, by exposed points of the lead frame, free of the conversion layer.

According to a further embodiment of the radiation emitting component, the semiconductor chip has a radiation transmissive carrier. The radiation transmissive carrier is in particular preferably permeable to the electromagnetic radiation generated in the active zone.

An epitaxial semiconductor layer sequence comprising the active zone is preferably applied to the carrier. The electromagnetic radiation generated in the active zone is emitted from a first main surface of the carrier, which is remote from the epitaxial semiconductor layer sequence. Furthermore, such a semiconductor chip emits electromagnetic radiation generated in the active zone, preferably also over side surfaces of the carrier. In other words, if the semiconductor chip has a radiation transmissive carrier, the radiation exit surface of the chip is usually formed by the side surfaces of the carrier and by the first main surface of the carrier. For example, the radiation transmissive carrier of the volume emitting semiconductor chip can be a growth substrate of the epitaxial semiconductor layer sequence.

A semiconductor chip with a radiation transmissive carrier, whose side surfaces and the first main surface form the radiation exit surface of the semiconductor chip, is also referred to as a "volume emitting semiconductor chip" due to its radiation characteristic.

In particular when using a semiconductor chip, which emits a part of its radiation via its side surfaces, which is formed, for example, by the side surfaces of the carrier, a non-negligible part of the radiation emitted by the semiconductor chips hits advantageously the conversion layer on the side walls of the reflector.

The semiconductor chip usually has two electrical contacts. The electrical contacts can both be arranged on a back side of the semiconductor chip, which is at least partially opposite a radiation exit surface. Furthermore, the electrical contacts can also both be arranged on a front side of the semiconductor chip that is opposite the back side. Finally, it is possible that one electrical contact is located on the front side of the semiconductor chip and the other electrical contact is located on the back side of the semiconductor chip.

According to a further embodiment, the component has a surface emitting semiconductor chip. The surface emitting semiconductor chip usually has a radiation exit surface, which runs parallel to a main extension plane of the semiconductor chip and comprises only a negligible portion of side surfaces of the semiconductor chip.

For example, the surface emitting semiconductor chip is a thin film semiconductor chip. The thin film semiconductor chip has a carrier that is different from a growth substrate for the epitaxial semiconductor layer sequence. Usually, a mirror layer is located between the epitaxial semiconductor layer sequence and the carrier, which directs electromagnetic radiation from the active zone, which is emitted towards the carrier, to the radiation exit surface of the semiconductor chip.

Further embodiments provide a method for manufacturing a radiation emitting component comprising a reflector, which has side walls and a bottom surface.

According to an embodiment of the method, a conversion layer is applied to the side walls, wherein the conversion layer has a cross-sectional area, which decreases from the bottom surface of the reflector to a radiation exit surface of the component.

According to a further embodiment of the method, a radiation emitting semiconductor chip is fixed to the bottom surface, for example, by soldering or gluing.

According to a further embodiment of the method, the conversion layer is applied to the side walls of the reflector by injection or casting.

It is possible that the conversion layer consists of several individual layers. The individual layers are preferably applied separately onto each other in different steps.

According to a further embodiment of the method, the bottom surface is also completely or partially provided with the conversion layer. For example, the following method steps are carried out in the specified sequence a)-c):

a) coating the side walls of the reflector with the conversion layer, (b) fixing the semiconductor chip to the bottom surface; and c) coating the bottom surface with the conversion layer.

According to a further embodiment of the method, the reflector is filled with a conversion element, which converts radiation of the first wavelength range into radiation of the third wavelength range.

The features and embodiments described herein in connection with the component can also be embodied during the method and vice versa.

BRIEF DESCRIPTION OF THE DRAWINGS

Further advantageous embodiments and developments of the component and the method result from the exemplary embodiments described in the following in connection with the figures.

FIG. 5 shows a schematic cross-sectional view of the radiation emitting component according to an exemplary embodiment;

FIG. 6 shows a table with performance parameters of a component according to an exemplary embodiment (right column) and of a conventional component (left column); and FIG. 7 shows a schematic cross-sectional view of a conventional radiation emitting component.

Same, similar, or equivalent elements have the same reference signs in the figures. The figures and the proportions of the elements depicted in the figures are not to be regarded as true to scale. Rather, individual elements, in particular layer thicknesses, may be exaggeratedly large for better representability and/or better understanding.

DETAILED DESCRIPTION OF ILLUSTRATIVE EMBODIMENTS

Figure 1:
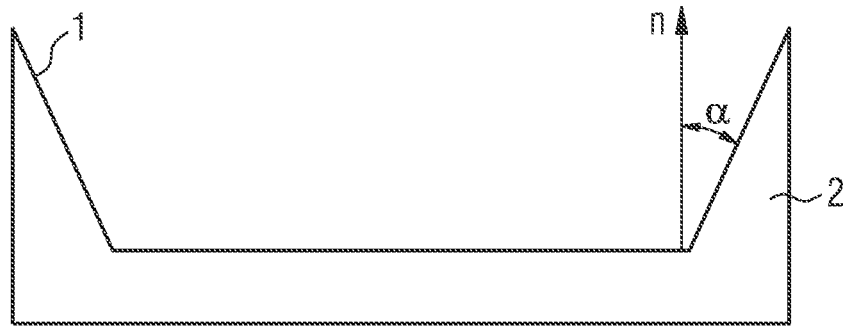
FIGS. 1 to 4 show schematic cross sectional views of an exemplary embodiment method.

During the method according to the exemplary embodiment of FIGS. 1 to 4, a reflector 1 is provided in a first step, which is shown schematically in FIG. 1. The reflector is formed by the recess in a housing 2. The housing 2 has a housing body and a lead frame, wherein no difference between housing body and lead frame is made in the figures.

The housing body has side walls, which form the side walls of reflector 1. The side walls of reflector 1 enclose an acute angle $\alpha$ with a normal n of a bottom surface of reflector 1. The housing body is made of a housing material such as plastic.

Figure 2:
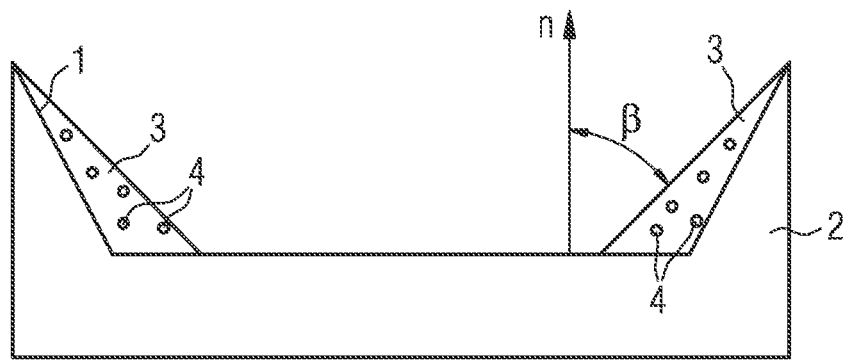

In a next step, which is shown schematically in FIG. 2, a conversion layer 3 is applied to the side walls of reflector 1. The conversion layer 3 has a cross-sectional area that decreases from the bottom surface of reflector 1 to a radiation exit surface of the component. The conversion layer 3 is formed from a first silicone resin with a refractive index between 1.3 and 1.45, inclusive, for light with a wavelength of 450 nanometers, in which particles of a first phosphor 4 are incorporated. The particles of the first phosphor 4 convert blue and green light into red light.

An outer surface of the conversion layer 3 encloses an angle $\beta$ with the normal n of the bottom surface of the reflector 1. The angle $\beta$ is larger than the angle $\alpha$.

Figure 3:
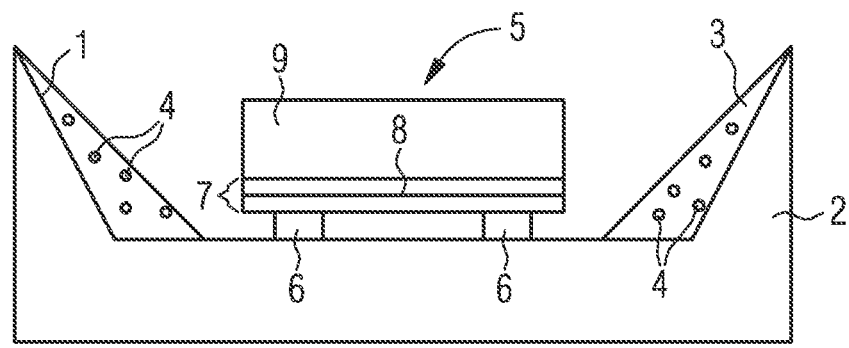

In a next step, which is schematically shown in FIG. 3, a semiconductor chip 5 is fixed to the bottom surface of the reflector 1. The bottom surface of the reflector 1 is free of the conversion layer 3.

The semiconductor chip 1 is a volume emitting semiconductor chip 1 with two electrical contacts 6 at the back side.

The semiconductor chip 1 further has an epitaxial semiconductor layer sequence 7 with an active zone 8, which generates electromagnetic radiation of a first wavelength range, blue light at present, during operation.

In addition, the semiconductor chip 5 has a radiation transmissive carrier 9 with a first main surface which, together with side surfaces of the carrier 9, forms a radiation exit surface of the semiconductor chip 1. The carrier 9, for example, is made of sapphire or comprises sapphire.

The epitaxial semiconductor layer sequence 7 is arranged on a second main surface of the carrier 9, which is opposite the first main surface.

Figure 4:
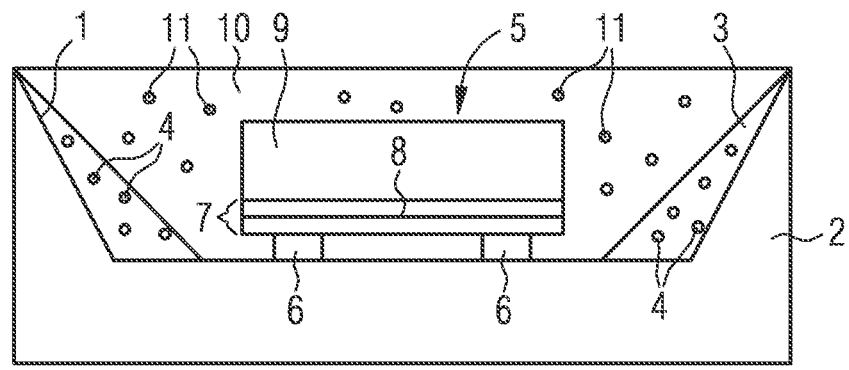

In a next step, which is schematically shown in FIG. 4, the recess, which is limited by the outer surface of the conversion layer 3 and the bottom surface of the reflector 1, is filled with a conversion element 10. The conversion element 10 is made of a second silicone resin into which particles of a second phosphor 11 are incorporated. The second phosphor is suitable for converting blue light, which is generated in the active zone of the semiconductor chip, into green light. The second silicone resin has a refractive index between 1.55 and 1.7, inclusive, for light with a wavelength of approximately 450 nanometers.

The finished component is designed in such a way that a part of the blue light, which is generated in the active zone 8 of the semiconductor chip 5, is converted into red light by the first phosphor 4 of the conversion layer 3. A further part of the blue light of the active zone 8 is converted into green light by the second phosphor 11 of the conversion element 10. From its radiation exit surface, the component emits mixed-colored white radiation composed of unconverted blue radiation, converted red radiation and converted green radiation.

In contrast to the component according to the exemplary embodiment of FIG. 4, the component according to the exemplary embodiment of FIG. 5 has a conversion layer 3, which is applied not only to the side surfaces of reflector 1 but also to the bottom surface of reflector 1 in direct contact.

FIG. 6 shows a table of the radiant power $\Phi_e$, of the light flux $\Phi_V$ and of the color rendering index CRI for a conventional component (left column) and a component according to an exemplary embodiment (right column). The values for the radiant power $\Phi_e$ and the light flux $\Phi_V$ are given both in absolute values with the unit Watt for the radiant power and the unit Lumen for the light flux and in percentage values.

The table in FIG. 6 shows that the radiant power $\Phi_e$, the light flux $\Phi_V$ and the color rendering index CRI of the component according to the exemplary embodiment are enhanced compared to the radiant power $\Phi_e$, the light flux $\Phi_V$ and the color rendering index CRI of a conventional component.

The conventional component, for example, is shown schematically in FIG. 7. In the conventional component, the first red emitting phosphor 4 and the second green emitting phosphor 11 are arranged together in a conversion layer 3 directly on the semiconductor chip 1 and on a bottom surface of the reflector 1.

The improvement of the efficiency of the component according to an exemplary embodiment is due to the fact that there are fewer light losses due to scattering on the housing 2 and on the lead frame and that there is less light absorption by the semiconductor chip 1 due to less scattering by the green phosphor 11.

The invention is not limited to the description of the embodiments. Rather, the invention comprises each new feature as well as each combination of features, particularly each combination of features of the claims, even if the feature or the combination of features itself is not explicitly given in the claims or embodiments.

The invention claimed is:

1. A radiation emitting component comprising:
 a radiation emitting semiconductor chip having an active zone configured to generate electromagnetic radiation of a first wavelength range;
 a reflector having side walls and a bottom surface; and
 a conversion layer comprising a first phosphor configured to convert the electromagnetic radiation of the first wavelength range into electromagnetic radiation of a second wavelength range,
 wherein the conversion layer is located at the side walls of the reflector,
 wherein the conversion layer has a cross-sectional area, which decreases from the bottom surface of the reflector to a radiation exit surface of the component,
 wherein the reflector is filled with a conversion element comprising a second phosphor configured to convert the electromagnetic radiation of the first wavelength range into electromagnetic radiation of a third wavelength range,
 wherein the conversion layer comprises a first silicone resin, in which particles of the first phosphor are incorporated,
 wherein the conversion element comprises a second silicone resin, and
 wherein a refractive index of the first silicone resin is smaller than a refractive index of the second silicone resin.

2. The radiation emitting component according to claim 1, wherein the conversion layer has an inclined outer surface which includes an angle between 10° and 70° inclusive, with a normal of the bottom surface.

3. The radiation emitting component according to claim 1, wherein a grain size of the first phosphor is smaller than a grain size of the second phosphor.

4. The radiation emitting component according to claim 1, wherein the first phosphor is configured to convert blue radiation into red radiation.

5. The radiation emitting component according to claim 1, wherein the first phosphor is formed as particles with a grain size between 5 micrometer and 20 micrometer inclusive.

6. The radiation emitting component according to claim 1, wherein the first silicone resin has a refractive index between 1.3 and 1.45 inclusive for light having a wavelength of about 450 nanometers.

7. The radiation emitting component according to claim 1, wherein the second phosphor is configured to convert blue radiation into green radiation.

8. The radiation emitting component according to claim 1, wherein the second phosphor is formed as particles with a grain size between 8 micrometer and 40 micrometer inclusive.

9. The radiation emitting component according to claim 1, wherein the second silicone resin has a refractive index between 1.55 and 1.7 inclusive for light having a wavelength of about 450 nanometers.

10. The radiation emitting component according to claim 1, wherein the bottom surface of the reflector is also covered with the conversion layer.

11. The radiation emitting component according to claim 1, wherein the semiconductor chip has a radiation transmissive carrier, to which an epitaxial semiconductor layer sequence is applied, and wherein the epitaxial semiconductor layer sequence comprises the active zone configured to also emit the electromagnetic radiation via side surfaces of the carrier.

12. A method for manufacturing a radiation emitting component, the method comprising:
 providing a reflector having side walls and a bottom surface;
 coating the side walls with a conversion layer, wherein the conversion layer has a cross-sectional area which decreases from the bottom surface of the reflector to a radiation exit surface of the component; and
 fixing a radiation emitting semiconductor chip to the bottom surface,
 wherein coating the side walls of the reflector with the conversion layer, fixing the semiconductor chip to the bottom surface, and coating the bottom surface with the conversion layer are performed in the specified order.

13. The method according to claim 12, wherein coating the side walls of the reflector with the conversion layer comprises coating by injection or casting.

14. The method according to claim 12, wherein the conversion layer is formed from several individual layers.

15. The method according to claim 12, further comprising filling the reflector with a conversion element.

\* \* \* \* \*